United States Patent [19]

Yoshizawa

[11] Patent Number: 4,635,036
[45] Date of Patent: Jan. 6, 1987

[54] ANALOG-TO-DIGITAL CONVERTER

[75] Inventor: Hisayasu Yoshizawa, Kawasaki, Japan

[73] Assignee: Kabushiki Kaisha Toshiba, Kawasaki, Japan

[21] Appl. No.: 790,175

[22] Filed: Oct. 22, 1985

[30] Foreign Application Priority Data

Nov. 15, 1984 [JP] Japan .................. 59-241386

[51] Int. Cl.[4] .......................................... H03M 1/36
[52] U.S. Cl. ............................................ 340/347 AD
[58] Field of Search .................................. 340/347 AD

[56] References Cited

U.S. PATENT DOCUMENTS 4,229,729 10/1980 Devendorf .................. 340/347 AD
4,417,233 11/1983 Inoue .......................... 340/347 AD Primary Examiner—Charles D. Miller
Attorney, Agent, or Firm—Cushman, Darby and Cushman

[57] ABSTRACT

An analog-to-digital converter including a reference voltage generator for generating coarse and fine reference voltages, a first group of comparators for comparing an analog input voltage with the coarse reference voltages, a second group of comparators and an encoder for encoding outputs of the comparators. The fine reference voltages and the analog input voltage are applied to a plurality of differential amplifiers which are organized into an odd number of groups, each group including an equal number of differential amplifiers. First outputs as well as second outputs of corresponding differential amplifiers of each groups are respectively added to each other. This added first and second output signals are respectively delivered to the second group of comparators. Outputs of the second groups of comparators are selectively inverted based on the outputs of the first group of comparators, thereby the most significant bits (MSB) and the least significant bits (LSB) are obtained in parallel.

7 Claims, 7 Drawing Figures

ANALOG-TO-DIGITAL CONVERTER

BACKGROUND OF THE INVENTION

The present invention relates in general an analog to digital (A/D) converters. More specifically, the invention provides an A/D converter suitable for use in digital video apparatus such as, for examples, digital television sets, digital video tape recorders or the like.

With the recent development of digital video apparatus, there is demand for a high-speed and high resolution A/D converter which can be manufactured as a monolithic integrated circuit (IC).

A conventional converter, so called a "full parallel converter", as disclosed in J. G. Peterson, "A Monolithic Video A/D Converter", in IEEE JOURNAL SOLID-STATE CIRCUITS, VOL. SC-14 No. 6, DECEMBER 1979, pp. 932–937, provides the best speed performance among known converters. However, a drawback of this type of converter is that it requires a great number of comparators ($2^n-1$) to obtain an n-bit binary coded parallel output signal. For example, an 8-bit converter requires 255 comparators. Furthermore, the number of elements used, especially the number of transistors, is large. Therefore, the full parallel converter is not suitable for monolithic integration.

On the other hand, as disclosed in R. J. VAN DE PLASSCHE et al "A High-Speed 7 Bit A/D Converter" in IEEE JOURNAL OF SOLID-STATE, VOL. SC-14. NO. 6, DECEMBER 1979, pp. 938–943, a two-step system converter is known in which a sample-and-hold circuit is used together with a high-speed A/D-D/A coarse quantizer subtractor circuit.

This type of converter includes a first-stage comparator A/D converter for providing the most significant bits of digital output and a second-stage comparator A/D converter for providing the least significant bits of the digital output.

In the first-stage converter first voltage comparators compare an analog input signal level to be converted into digital form with a plurality of first reference voltage levels. A first decoder provides the most significant bits in response to the comparison result. The most significant bits are converted by a digital-to-analog (D/A) converter into an analog voltage. The difference between the converted analog voltage and the analog input signal is obtained.

In the second stage converter, the analog voltage difference is compared by second voltage comparators with a plurality of second reference voltage levels. A second decoder produces the least significant bits on the basis of the comparison result. Such a two-step converter can be made with a reduced number of comparators vis-a-vis a full parallel converter.

However, the conversion speed of this type of converter is lower than that of the full parallel converter and it is not suitable for use at video frequencies. Furthermore, it is not suitable for monolithic integration.

SUMMARY OF THE INVENTION

It is an object of the present invention to provide an A/D converter capable of high speed conversion.

It is another object of the present invention to provide an A/D converter which is suitable for monolithic integration with a reduced number of elements compared with known converter arrangements having the same capacity.

In accordance with a preferred embodiment of the present invention, there is provided a reference voltage generator including a resistor string for generating first comparison reference voltage by dividing a voltage applied across the resistor string into a plurality of reference regions and for generating second comparison reference voltages by dividing each of the first comparison reference voltages. The first comparison reference voltage is compared with an analog input signal to be converted into a digital signal by a plurality of first comparators. Output signals of the first comparators are delivered to first coding means so as to provide most significant bits of the digital signal. The output signal of the first comparators are also delivered to a region detector to detect which region of the reference regions the analog input signal level corresponds to.

The second comparison reference voltages are applied to a plurality of differential amplifiers together with the analog signal, respectively. The differential amplifiers are organized into an odd number of groups, each group including an equal number of differential amplifiers. The differential amplifier of odd-numbered groups produce a high level output signal at its first output terminal and a low level output signal at its second output terminal while the differential amplifier of even-numbered groups produces a low output signal at its first output terminal and a high level signal at its second output terminal when the analog input signal is greater than the second comparison reference voltage.

Output signals, which are produced at the first output terminals of corresponding differential amplifiers of each group, are added to each other by first adding means. Output signals of the second output terminals are also added to each other by second adding means. Outputs of the first and second adding means are compared with each other by a plurality of second comparators.

Outputs of the comparators are selectively inverted in response to an output from the detecting circuit and then coded by second coding means to provide the least significant bits.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings in which.

DETAILED DESCRIPTION OF THE PREFERRED EMBODIMENT

Figure 1:
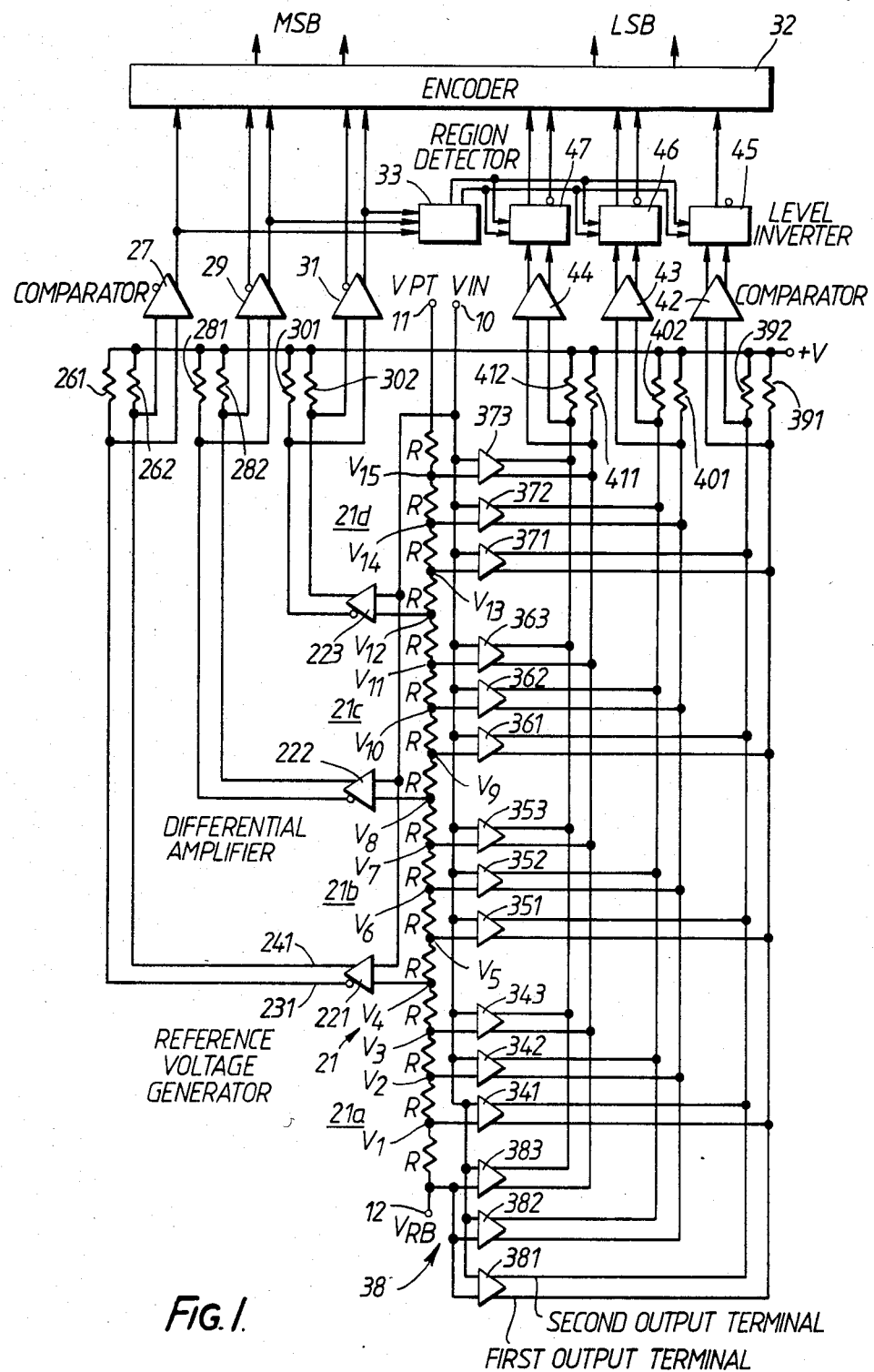
FIG. 1 shows a 4-bit A/D converter according to an embodiment of the present invention.

Referring to FIG. 1, an analog input signal Vin to be converted into digital form is applied to a signal input terminal 10 for coupling to input terminals of each of differential amplifiers 221, 222 and 223. Comparison reference voltages $V_{RB}$ and $V_1$ to $V_{15}$ to be compared with the analog input signal are generated by a reference voltage generator 21. Reference voltage generator 21 includes input terminal 11 and 12, and a plurality of series-connected resistors R, i.e., a resistor string, connected between the input terminals 11 and 12. Between the resistors of the string are applied voltages $V_{RT}$ and $V_{RB}$ which correspond to the dynamic range of the analog input signal. Reference voltage generator 21 equally divides the reference voltage ($V_{RT}$-$V_{RB}$) applied between the resistors of the string into four reference regions 21a, 21b, 21c and 21d so as to generate first comparison reference voltages $V_4$, $V_8$ and $V_{12}$. Furthermore, reference voltage generator 21 equally divides each of the first comparison reference voltages $V_4$, $V_8$ and $V_{12}$ so as to generate second comparison reference voltages $V_{RB}$, $V_1$ to $V_3$, $V_5$ to $V_7$, $V_9$ to $V_{11}$ and $V_{13}$ to $V_{15}$.

Figure 2:
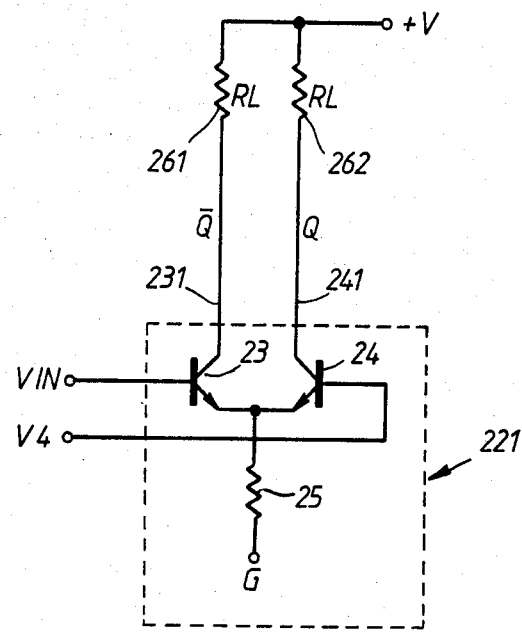
FIG. 2 shows a specific circuit arrangement of the differential amplifier in FIG. 1.

First comparison reference voltages $V_4$, $V_8$ and $V_{12}$ generated by reference voltage generator 21 are applied to the other input terminal of differential amplifiers 221, 222 and 223, respectively. As shown in FIG. 2, differential amplifier 221 includes a pair of transistors 23 and 24 having base electrodes to which the analog input voltage $V_{in}$ and the first comparison reference voltage $V_4$ are respectively applied, emitter electrodes commonly connected to the ground G through a resistor 25, and collector electrodes connected to a voltage source (+V) through load resistors 261 and 262, respectively.

Figure 3:
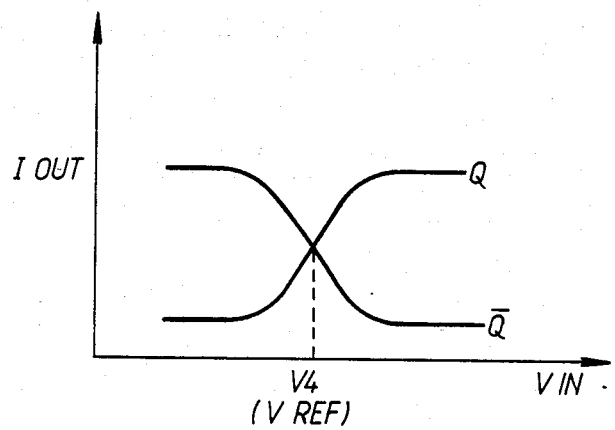
FIG. 3 is a graph showing an input/output characteristic of the differential amplifier.

In the arrangement thus constructed, when the analog input voltage $V_{in}$ and the first comparison reference voltage $V_4$ are applied, output currents $I_O$, i.e., collector currents corresponding to the magnitude of these voltages are produced at the collector electrodes of transistors 23 and 24 as shown in FIG. 3. As a result, outputs Q and $\bar{Q}$ of logic 1 (hereinafter "1") or logic 0 (hereinafter "0") are produced at output terminals 241 and 231. The other differential amplifiers 222 and 223 have also same construction as comparator 221.

Referring again to FIG. 1, the outputs Q and $\bar{Q}$ produced at output terminals 241 and 231 of differential amplifier 221 are applied to a comparator 27 to compare their voltage level with each other. Comparator 27, which is a conventional comparator, for example, as shown in the previously cited J. G. Peterson, "A Monolithic Video A/D Converter" in IEEE JOURNAL SOLID-STATE CIRCUITS, VOL. SC-14, NO. 6, DECEMBER 1979, P934, produces an output "0" when the outputs Q and $\bar{Q}$ from differential amplifier 221 are "0" and "1", respectively, that, is when $V_{in} > V_4$, and produces an output "1" when Q and $\bar{Q}$ are "1" and "0", respectively.

Similarly, the outputs of differential amplifiers 222 and 223 are applied to comparators 29 and 31 which have the same construction as comparator 27.

The output of these comparators 27, 29 and 31 are supplied to an encoder 32 which encodes them to provide the two most significant bits (hereinafter 2MSB).

Figure 4:
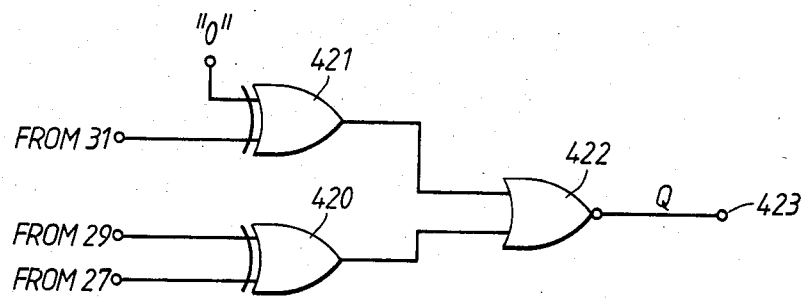
FIG. 4 shows a specific circuit arrangement of the region detector in FIG. 1.

The outputs of comparators 27, 29 and 31 are also applied to a region detector 33 for detecting which of the four reference regions 21a to 21d the analog input voltage $V_{in}$ exist in. As shown in FIG. 4, region detector 33 includes Exclusive-OR circuits 420 and 421 and NOR circuits 422. The outputs from comparators 27 and 29 are applied to the input terminals of Exclusive-OR circuit 420, respectively. On the other hand, the output from comparator 31 is applied to one input terminal of Exclusive-OR circuit 421, and a signal "0" is applied to the other input terminal of Exclusive-OR circuit 241. Outputs of Exclusive-OR circuits 420 and 421 are applied to NOR circuits 422 to produce a region detecting signal at an output terminal 423.

In accordance with the arrangement thus constructed, region detector 33 produces an output "1" at output terminal 423 when the analog input voltage $V_{in}$ exists in the reference region 21a or 21c, and produces and output "0" when $V_{in}$ in the reference region 21b or 21d as shown in Table 1.

TABLE I

| REGION | OUTPUT OF COMP. 27 | OUTPUT OF COMP. 29 | OUTPUT OF COMP. 29 | OUTPUT OF NOR 422 |
|---|---|---|---|---|
| 21a ($V_{in}<V_4$) | 0 | 0 | 0 | 1 |
| 21b ($V_4 \leq V_{in}<V_8$) | 1 | 0 | 0 | 0 |
| 21c ($V_8 \leq V_{in}<V_{12}$) | 1 | 1 | 0 | 1 |
| 21d ($V_{12} \leq V_{in}$) | 1 | 1 | 1 | 0 |

The analog input signal $V_{in}$ applied at signal input terminal 10 is also applied to respective one input terminal of differential amplifiers 341 to 343, 351 to 353, 361 to 363, 371 to 373 and 381 to 383 which are organized into an odd number of groups (five groups in this embodiment), each group including equal number of differential amplifiers (three amplifiers in this embodiment). These amplifiers have the same construction as differential amplifiers 221 to 223 shown in FIG. 2. The second comparison reference voltages $V_1$ to $V_3$, $V_5$ to $V_7$, $V_9$ to $V_{11}$ and $V_{13}$ to $V_{15}$ are applied to the respective other input terminal of differential amplifiers 341 to 343, 351 to 353, 361 to 363 and 371 to 373. With respect to differential amplifiers 381 to 383, second comparison reference voltage $V_{RB}$ is commonly applied to their other input terminals.

Each differential amplifier in odd number groups 381 to 383, 351 to 353 and 371 to 373 produces a high level output signal at the first output terminal of its amplifier and a low level output signal at the second output terminal of its amplifier, while each differential amplifier in even number groups 341 to 343 and 361 to 363 produces a low level output signal at the first output terminal of its amplifier and a high level output signal at the second output terminal of its amplifier when the analog input signal $V_{in}$ applied to its amplifier is greater than the second comparison reference voltage applied to its amplifier.

The first output terminals of differential amplifier 381, 341, 351, 361 and 371 are connected to each other and then connected to a voltage source terminals (+V) through a resistor 391 so that an added voltage (hereinafter a first added voltage) of the output signals produced at the first output terminals of these amplifiers 381, 341, 351, 361 and 371 is produced at an end of resistor 391. Similarly, the second output terminals of differential amplifiers 381, 341, 351, 361 and 371 are connected to each other and then connected to voltage source terminal (+V) through a resistor 392 so that an added voltage (hereinafter a second added voltage) of the output signals produced at the second output terminals is produced at an end of resistor 392.

In like manner, each first and second output terminals of differential amplifiers 382, 342, 352, 362 and 372 are connected to each other, and also connected to voltage source terminal (+V) through resistors 401 and 402, respectively, and output terminals of differential amplifiers 383, 343, 353, 363 and 373 are connected to each other, and also connected to voltage source terminal (+V) through resistors 411 and 412, respectively.

The first and second voltages each produced at the end of resistors 391 and 392 are applied to a comparator 42. Similarly, the first and second voltages each produced at the end of resistors 401 and 402 are applied to a comparator 43, and the first and second added voltages produced at the end of resistors 411 and 412 are applied to a comparator 44.

Comparators 42, 43 and 44 respectively compare the first added voltages with the second added voltages, then produce an output "0" when the first added voltage is greater than the second output voltage, which produce an output "1" when the second added voltage is greater than the first added voltage.

Outputs of comparators 42, 43 and 44 are applied to level inverters 45, 46 and 47, respectively. Level inverters 45, 46 and 47 selectively invert the level of outputs of comparators 45, 46 and 47, respectively. Level inverters 45, 46 and 47 selectively invert the level of outputs of comparators 45, 46 and 47 in response to the output signals from the region detector 33.

Figure 5:
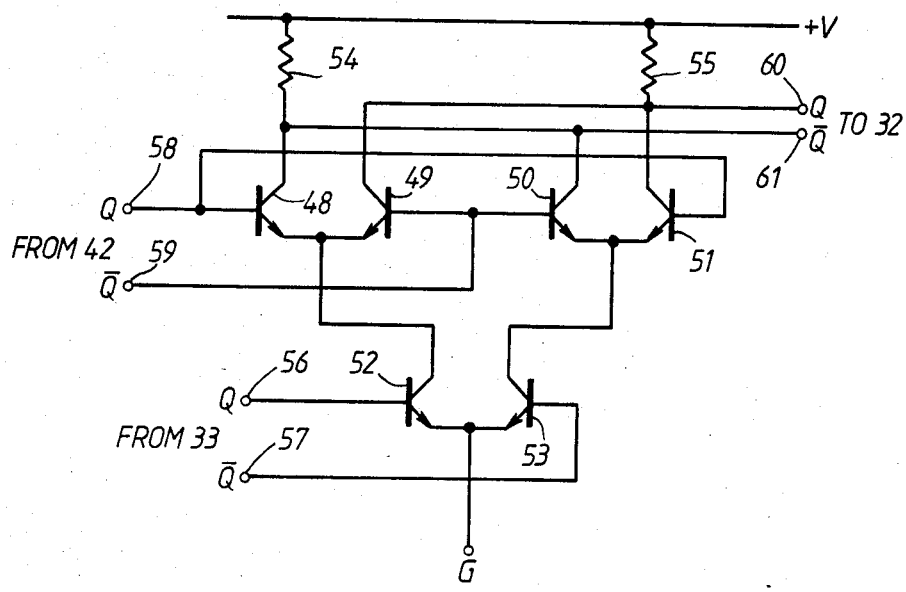
FIG. 5 shows a specific circuit arrangement of the level-inverter in FIG. 1.

As shown in FIG. 5, level inverter 45 includes emitter-coupled switching transistor pairs 48, 49; 50, 51; 52, 53. The collectors of transistors 52 and 53 are respectively connected to the emitters of transistor pairs 48, 49 and 50, 51. The emitters of transistors 52 and 53 are connected to the ground G through a current source 500 and the bases of its transistors 52 and 53 are respectively connected to control terminals 56 and 57 to which the output signals of region detectors 33 are applied. The collectors of transistors 48 and 50 are connected to each other and then connected to a voltage source terminal through a resistor 54, the collectors of transistors 49 and 51 are connected to each other, then connected to the voltage source terminal through a resistor 55, the bases of transistors 48, 51; 49, 50 are respectively connected to input terminals 58 and 59 to which the outputs of comparators 42 are applied. The collectors of transistors 51 and 50 are respectively connected to output terminals 60 and 61. Level inverters 46 and 47 also have the same construction as level inverter 45.

When the analog input voltage $V_{in}$ exists in the reference region 21a or 21c, the signal "1" is applied to control terminal 56 and the signal "0" to control terminal 57 from region detector 33. In this case, the input signals applied at input terminals 58 and 59 are delivered to output terminals 60 and 61 without the inversion of its level. On the other hand, when the analog input voltage $V_{in}$ exists in the reference region 21b or 21d, the signal "1" is applied to control terminal 57 and the signal "0" to control terminal 56, thus the input signals applied at input terminals are inverted to output terminals 60 and 61.

The output signals of level inverters 45, 46 and 47 are applied to encoder 32 to produce two least significant bits (hereinafter 2LSB).

Figure 6:
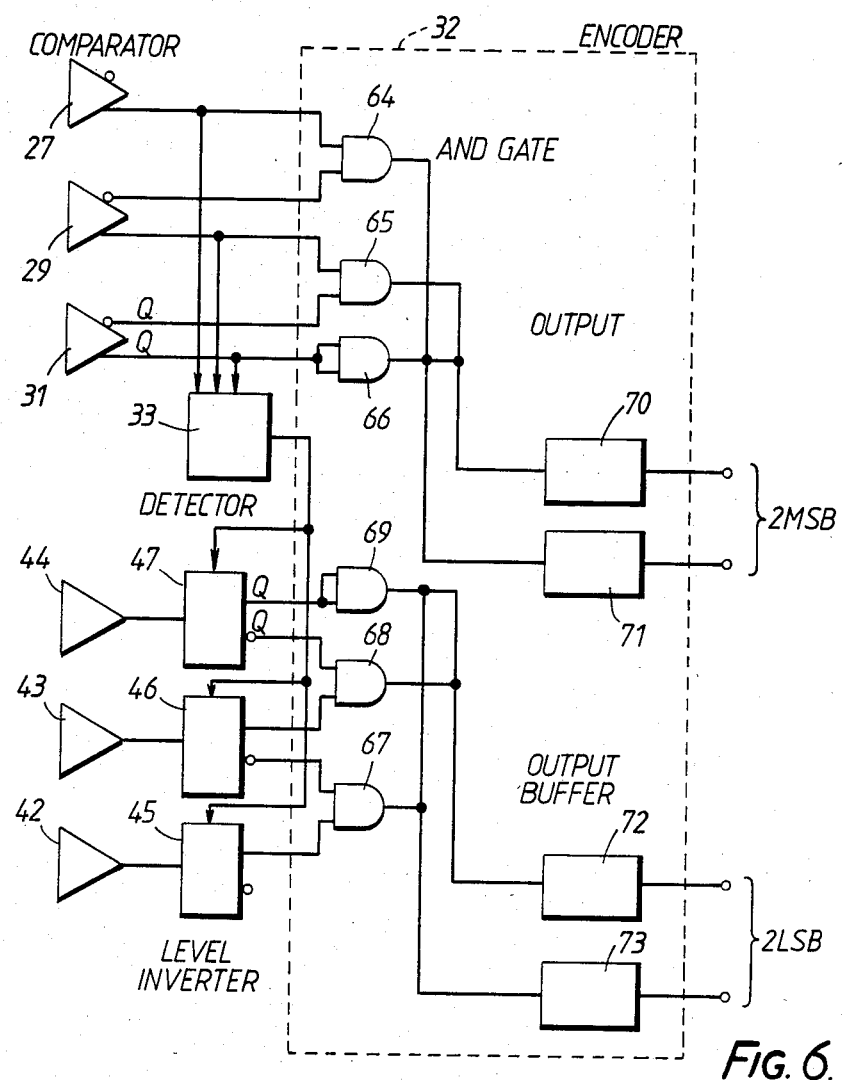
FIG. 6 shows a specific circuit arrangement of the encoder in FIG. 1.

FIG. 6 shows a practical arrangement of encoder 32. Encoder 32 includes a plurality of AND gates 64, 65, 66, 67, 68 and 69 and output buffers 70, 71, 72 and 73. AND gate 64 receives the output Q comparator 27 and the output $\overline{Q}$ of comparator 29, AND gate 65 receives the output Q of comparator 29 and the output Q of comparator 31 and AND gate 66 receives the output $\overline{Q}$ of comparator 31. Outputs of AND gates 65 and 66 are added to each other and then apply to output buffer 70. Similarly, outputs of AND gates 65 and 66 are added to each other and then apply to output buffer 71. As a result, 2MSB are produced at output terminals of output buffers 70 and 71.

AND gates 67 receives the output Q of level inverter 45 and the output $\overline{Q}$ of level inverter 46, AND gate 68 receives the output Q of level inverter 46 and the output $\overline{Q}$ of level inverter 47 and AND gate 69 receives the output Q of level inverter 47. Output of AND gates 68 and 69 are added to each other and then applied to output buffer 72. Similarly, outputs of AND gates 67 and 69 are added to each other, than applied to output buffer 73. As a result, the 2LSB are produced at output terminals of output buffers 72 and 73.

In the arrangement of A/D converter thus constructed, when the analog input voltage $V_{in}$ is less than $V_4$, differential amplifiers 221, 222 and 223 produce output "1" at inverted output terminals and outputs "0" an non-inverted output terminals, respectively. Therefore, all comparators 27, 29 and 31 produce outputs "0" to encoder 32. Encoder 32 encodes the outputs from comparators 27, 29 and 31 to produce the two most significant bits (2MSB) "0 0" as shown in Table 2.

When the analog input voltage $V_{in}$ is in the range of $V_4 \leq V_{in} < V_8$, the output level of differential amplifier 221 is inverted. As a result, comparator 27 produces an output "1" while comparators 29 and 31 produce output "0". Therefore, encoder 32 produces the 2MSB "0 1".

Similarly, when the analog input voltage is in the range of $V_8 \leq V_{in} < V_{12}$ and furthermore when in the range of $V_{12} \leq V_{in}$, comparators 27, 29 and 31 and encoder 32 produce outputs as shown in Table 2.

TABLE 2

| OUTPUT LEVEL OF COMPARATOR 27 | OUTPUT LEVEL OF COMPARATOR 29 | OUTPUT LEVEL OF COMPARATOR 31 | 2 M.S.B. |
|---|---|---|---|
| 0 | 0 | 0 | 00 |
| 1 | 0 | 0 | 01 |
| 1 | 1 | 0 | 10 |
| 1 | 1 | 1 | 11 |

The two least significant bits (2LSB) of the digital signal corresponding to the analog input signal are obtained as follows. When the analog input voltage is in the range of $V_{RB} < V_{in} < V_1$, differential amplifiers 381, 382 and 383 in the supplementary region 38 produce outputs "1" at their first output terminals and outputs "0" at their second output terminals, respectively. On the other hand, differential amplifiers 341 to 343 and 361 to 363 in the reference regions 21a and 21c produce outputs "1" at their first output terminals and outputs "0" at their second output terminals and differential amplifiers 351 and 371 to 373 in the reference regions 21b and 21d produce output "0" at their first output terminals and the output "1" at their second output terminals. The output "1" produced at the first output terminals of differential amplifiers 381, 351 and 371 are added to the outputs "0" produced to the first output terminals of differential amplifiers 341 and 361. As a result, an output "1" is produced at on input terminal of comparator 42. Similarly, the outputs "0" produced at the second output terminals of differential amplifiers 381, 351 and 371 are added to the outputs "1" produced at the second output terminals of differential amplifiers 341 and 361. As a result, an output "0" is produced at the other input terminals of comparator 42. Therefore, comparator 42 produces an output "0". Similarly, comparator 43 and 44 produce outputs "0", respectively.

When the analog input voltage $V_{in}$ is in the range of $V_1 \leq V_{in} < V_2$, the output level of differential amplifier 341 is inverted. Therefore, the respective level of the input signals of comparator 42 is inverted. As a result, comparator 42 produces an output "1". Similarly, when the analog input voltage $V_{in}$ is in the rage of $V_2 < V_{in} < V_3$ and when $V_3 < V_{in} < V_4$, comparator 43 and 44 respectively produce outputs as shown in regions (a) of Table 3.

TABLE 3

| | | OUTPUT LEVEL OF COMPARATOR 42 | OUTPUT LEVEL OF COMPARATOR 43 | OUTPUT LEVEL OF COMPARATOR 44 | 2 L.S.B. |
|---|---|---|---|---|---|
| | $V_{RB} \leq V_{in} \leq V_1$ | 0 | 0 | 0 | 00 |
| (a) | $V_1 \leq V_{in} < V_2$ | 1 | 0 | 0 | 01 |
| | $V_2 \leq V_{in} < V_3$ | 1 | 1 | 0 | 10 |
| | $V_3 \leq V_{in} < V_4$ | 1 | 1 | 1 | 11 |
| | $V_4 \leq V_{in} < V_5$ | 1 | 1 | 1 | 00 |
| (b) | $V_5 \leq V_{in} < V_6$ | 0 | 1 | 1 | 01 |
| | $V_6 \leq V_{in} < V_7$ | 0 | 0 | 1 | 10 |
| | $V_7 \leq V_{in} < V_8$ | 0 | 0 | 0 | 11 |
| | $V_8 \leq V_{in} < V_9$ | 0 | 0 | 0 | 00 |
| (c) | $V_9 \leq V_{in} < V_{10}$ | 1 | 0 | 0 | 01 |
| | $V_{10} \leq V_{in} < V_{11}$ | 1 | 1 | 0 | 10 |
| | $V_{11} \leq V_{in} < V_{12}$ | 1 | 1 | 1 | 11 |
| | $V_{12} \leq V_{in} < V_{13}$ | 1 | 1 | 1 | 00 |
| (d) | $V_{13} \leq V_{in} < V_{14}$ | 0 | 1 | 1 | 01 |
| | $V_{14} \leq V_{in} < V_{15}$ | 0 | 0 | 1 | 10 |
| | $V_{15} \leq V_{in}$ | 0 | 0 | 0 | 11 |

When the analog input voltage $V_{in}$ is in the range of $V_{RB} < V_{in} < V_4$, level inverters 45, 46 and 47 do not invert the levels of the outputs from comparators 42 to 47. Thus, encoder 32 produces the 2LSB shown in the region (a) in the Table 3. In this case, the 2MSB are "0 0" as shown in Table 2.

When the analog input voltage $V_{in}$ is in the range of $V_4 \leq V_{in} < V_5$, $V_5 \leq V_{in} < V_6$, $V_6 \leq V_{in} < V_7$ and $V_7 \leq V_{in} < V_8$, comparators 42, 43 and 44 respectively produce the outputs shown in the region (b) in the Table 3. In this case, however, these outputs are inverted by level inverters 45, 46 and 47 in response to them outputs from region detector 33. Therefore, encoder 32 produces the 2LSB shown in the range (b) in the Table 3. In this case, 2MSB are "0 1".

Similarly, when the analog input voltage $V_{in}$ is in the range $V_8 \leq V_{in} < V_{11}$ or $V_{12} \leq V_{in} < V_{15}$, comparators 42, 43 and 44 and encoder 32 respectively produce the outputs and 2LSB shown in the region (c) or (d) in the Table 3.

The most significant bits and the least significant bits are obtained in parallel so that high-speed A/D conversion is performed. Furthermore, it can be made with a reduced number of comparators which need a great number of circuit devices. It does not need a sample and hold circuit which employs special devices such as a Schottoky junction transistor or the like. Accordingly, the A/D converter according to the present invention is suitable to for monolithic integration.

The present invention has been described in terms of a 4-bit A/D converter embodiment, but the number of bits of digital output is not limited to four. Furthermore, in the embodiment described above, since the reference voltage ($V_{RT}$-$V_{RB}$) is divided into four (the even number) regions 21a to 21d, differential amplifiers 381 to 383 in the supplementary region 38 are needed so as to provide odd number of groups of differential amplifiers. However, when the reference voltage ($V_{RT}$-$V_{RB}$) is divided into the odd number, the supplementary region is not needed itself. Furthermore, in the embodiment described above, while differential amplifiers 221, 222 and 223 are employed to obtain the two most significant bits, they may be omitted by means of directly comparing the analog input voltage $V_{in}$ with the first comparison reference voltage by comparators 27, 29 and 31.

Figure 7:
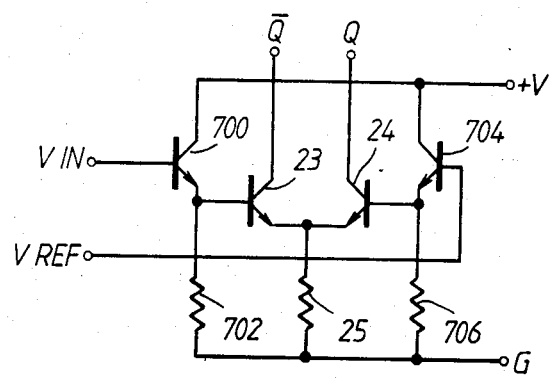
FIG. 7 shows another specific circuit arrangement of the differential amplifier in FIG. 1.

The practical arrangements of the differential amplifier, region detector, level inverter, etc., are not limited to those shown in this embodiment. For example, a differential amplifier shown in FIG. 7 may be employed instead of the arrangement shown in FIG. 2. This differential amplifier is provided with emitter follower circuits each including a transistor 700, 704 and a resistor 702, 706 at the each input stages of transistors 23 and 24. By providing with these emitter follower circuits the differential amplifier is not affected by the change of the comparison reference voltage $R_{ref}$. In addition, the pair of transistors 23 and 24 may exhibit their ability so that it contributes to the accurate comparison by the comparator.

While the present invention has been described in connection with what is presently considered to be the most practical and preferred embodiments, it is to be understood that the present invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. An analog to digital converter for converting an analog input signal into an output digital signal, comprising:
    a pair of terminals between which a predetermined voltage is applied;
    reference voltage generator means, connected to said terminals, for generating first comparison reference voltages by dividing said voltage applied between said terminals into a plurality of reference regions and for generating second comparison reference voltages by dividing each of said first comparison reference voltages;

first comparator means for comparing said first comparison reference voltages with said analog input signal;

first coding means for coding outputs of said first comparator means so as to provide most significant bits of said output digital signal;

region detector means, coupled to an output of said first comparator means, for detecting which region of said reference regions the level of said analog input signal corresponds to;

an odd number of groups of differential amplifiers, each group having the same number of amplifiers therein, each amplifier having a pair of input terminals to which one of said second comparison reference voltages and said analog input voltage are respectively applied, and first and second output terminals, the differential amplifier of odd number groups producing a high level output signal at said first output terminal of its amplifier and a low level output signal at said second output terminal of its amplifier, while the differential amplifier of even number groups producing a low level output signal at said first output terminal of its amplifier and a high level output signal at said second output terminal of its amplifier when the analog input signal applied to a particular amplifier is greater than the second comparison reference voltage applied to that amplifier;

first adding means for adding output signals produced at said first output terminals of corresponding differential amplifiers of said respective groups;

second adding means for adding output signals produced at said second output terminals of corresponding differential amplifiers of said respective groups;

second comparator means for comparing outputs of said first adding means with output of said second adding means;

inverting circuit means for selectively inverting the level of outputs of said second comparator means in response to an output from said region detector means; and second coding means for coding an output from said inverting circuit means so as to provide least significant bits of said output digital signal.

2. An analog to digital converter according to claim 1 wherein said reference voltage generator means includes a plurality of series-connected resistors.

3. An analog to digital converter according to claim 1 further comprising: a plurality of differential amplifiers, each amplifier having a pair of input terminals to which one of said first comparison reference voltages and said analog input voltage are applied and a pair of output terminals which are respectively connected to input terminals of said first comparator means.

4. An analog to digital converter according to claim 1, wherein said region detector means includes at least one logic circuit for comparing outputs of said first comparator means with each other and producing the output of different level between adjacent regions of said reference regions to which the level of said analog input signal corresponds.

5. An analog to digital converter according to claim 1, wherein differential amplifiers in a particular group of said odd number of differential amplifiers commonly supplied with a particular reference voltage of said second reference voltages when said voltage applied between said terminals is divided into an even number of reference region.

6. An analog to digital converter according to claim 1, wherein said inverter circuit means includes first and second transistors having emitters connected to each other and bases between which the outputs of said second comparator means are applied, third and fourth transistors having emitters connected to each other, bases between which the outputs of said second comparator are applied and collectors respectively connected to collectors of said second and first transistors, and fifth and sixth transistors having emitters connected to each other, bases between which the outputs of said region detector means are applied and collectors respectively connected to the commonly connected emitters of said first and second transistors and third and fourth transistors.

7. An analog to digital converter according to claim 1, wherein said differential amplifier includes a pair of emitter-coupled transistors and emitter follower circuits providing at input stages of said emitter-coupled transistors.

* * * * *